United States Patent
Hoskins (10) Patent No.: US 10,192,630 B1
(45) Date of Patent: Jan. 29, 2019

(54) TRACK-AND-HOLD CIRCUIT WITH ACQUISITION GLITCH SUPPRESSION

(75) Inventor: Michael J. Hoskins, Monument, CO (US)

(73) Assignee: HITTITE MICROWAVE LLC, Chelmsford, MA (US)

( * ) Notice: Subject to any disclaimer, the term of this patent is extended or adjusted under 35 U.S.C. 154(b) by 0 days.

(21) Appl. No.: 13/506,329

(22) Filed: Apr. 12, 2012

(51) Int. Cl.
*G11C 27/02* (2006.01)

(52) U.S. Cl.
CPC ............ *G11C 27/02* (2013.01); *G11C 27/024* (2013.01); *G11C 27/026* (2013.01); *G11C 27/028* (2013.01)

(58) Field of Classification Search
CPC ..... G11C 27/02; G11C 27/024; G11C 27/026; G11C 27/028
USPC ........ 327/96, 91, 94, 95, 97, 51, 52, 54, 63, 327/65, 67, 563
See application file for complete search history.

(56) References Cited

U.S. PATENT DOCUMENTS

| | | | |
|---|---|---|---|
| 5,130,572 A * | 7/1992 | Stitt et al. | 327/96 |
| 5,298,801 A | 3/1994 | Vorenkamp et al. | |
| 5,517,141 A * | 5/1996 | Abdi et al. | 327/96 |
| 5,734,276 A | 3/1998 | Abdi et al. | |
| 6,028,459 A | 2/2000 | Birdsall et al. | |
| 6,794,920 B1 * | 9/2004 | Aliahmad et al. | 327/307 |
| 6,954,168 B2 | 10/2005 | Hoskins | |
| 7,088,148 B2 | 8/2006 | Devendorf et al. | |
| 7,969,336 B2 * | 6/2011 | Yoshioka | 341/122 |
| 8,350,738 B2 * | 1/2013 | Sanduleanu et al. | 341/120 |

\* cited by examiner

*Primary Examiner* — Jung Kim
(74) *Attorney, Agent, or Firm* — Knobbe, Martens, Olson & Bear, LLP (57) ABSTRACT

The track-and-hold circuit includes a switching circuit and a plurality of storage devices. The switching circuit responsive to an input signal applies a representation of the input signal to the storage devices in a track mode and blocks a signal path between the input signal and the storage device in a hold mode such that a transition from the track mode to a hold mode causes the storage devices to store a time sample of the input signal. An acquisition glitch suppression circuit includes a replica amplifier coupled to the switching circuit that senses a differential voltage across the storage devices. A switched clamping circuit clamps inputs of the switching circuit to the sensed differential voltage in the hold mode such that the initial condition of switching transistors of the switching circuit are approximately identical prior to a hold-to-track transition to mitigate differential acquisition glitch.

21 Claims, 10 Drawing Sheets

| Applying a representation of an input signal to a plurality of storage devices of a track-and-hold-circuit in a track mode |
| --- |
| 300 |

↓

| A signal path between the input signal and the plurality of the storage devices is blocked in a hold mode such that a transition from the track mode to the hold mode causes the storage device to store a time sample of the input signal |
| --- |
| 302 |

↓

| The differential voltage accross the storage devices is sensed |
| --- |
| 304 |

↓

| The inputs of the switching circuit are clamped to the sensed differential voltage in the hold mode such that the initial condition of voltages across the switching circuit are approximately identical prior to a hold-to-track transition to mitigate differential acquisition glitch magnitude |
| --- |
| 306 |

TRACK-AND-HOLD CIRCUIT WITH ACQUISITION GLITCH SUPPRESSION

FIELD OF THE INVENTION

This invention relates to a track-and-hold circuit with acquisition glitch suppression.

BACKGROUND OF THE INVENTION

A track-and-hold circuit (T/H) may be used to sample and condition analog signals. A T/H is often used at the front end of analog-to-digital converters (ADCs) to sample a signal and then hold the signal sample constant-such that conversion circuitry of the ADC has time to convert and process the sample. The T/H function typically involves high speed switching of analog signals. As a result, the T/H may often exhibit glitches in its output waveform, often referred to as acquisition glitches. The acquisition glitch, which occurs after the hold-to-track transition when the device is tracking and acquiring the signal, tends to be the dominant glitch or perturbation in the output waveform of a switched T/H, such as a switched emitter follower (SEF) T/H, a diode bridge switched T/H, or similar type switched T/H. The acquisition glitch is typically impulsive and has very high energy and very short time duration. This may tend to excite any ringing responses that may be present in the signal path or the input circuit of the downstream ADCs often used with a T/H. The acquisition glitch may cause input level compatibility problems in ADCs. The ringing/settling time associated with the response of the ADCs to the glitch can slow down the permissible sample rate and degrade conversion accuracy.

It is therefore desirable to achieve a T/H design with minimized glitch amplitude, particularly in high speed applications where sampling bandwidths extend to several GHz and ringing phenomena can be difficult to control due to sensitivity to small parasitic elements.

SUMMARY OF THE INVENTION

This invention features a switched track-and-hold circuit with acquisition glitch suppression including a track-and-hold circuit. The track-and-hold circuit includes a switching circuit and a plurality of storage devices. The switching circuit is responsive to an input signal and configured to apply a representation of the input signal to the storage devices in a track mode and block a signal path between the input signal and the storage device in a hold mode such that a transition from the track mode to a hold mode causes the storage devices to store a time sample of the input signal. An acquisition glitch suppression circuit includes a replica amplifier coupled to the switching circuit configured to sense a differential voltage across the storage devices. A switched clamping circuit is configured to clamp inputs of the switching circuit to the sensed differential voltage in the hold mode such that the initial condition of switching transistors of the switching circuit are approximately identical prior to a hold to track transition to mitigate differential acquisition glitch magnitude.

In one embodiment, the switched track-and-hold circuit may include an output buffer amplifier configured to buffer high impedance storage nodes coupled to the storage devices to provide low output impedance to drive at least one external device. The circuit may include a buffer amplifier circuit coupled between the switching device and the output buffer amplifier configured to buffer high impedance storage nodes coupled to the storage devices to provide low output impedance to the output buffer amplifier. The switching circuit may include a plurality of switched emitter-followers. The initial condition may include setting base voltages of each of the switched emitter followers to a predetermined value which creates the same base-emitter voltage and base-emitter capacitance on each emitter follower. The circuit may include at least one differential current switch coupled to the switched emitter-follower. The circuit may include at least one current source coupled to at least one differential current switch. The circuit may include a buffer amplifier coupled between the plurality of switched emitter followers and the replica amplifier. The replica amplifier may include a differential amplifier coupled to the buffer amplifier. The replica amplifier may include cascode amplifiers coupled to the differential amplifier. The replica amplifier may include a plurality of emitter-followers coupled to the cascode amplifier. The clamping circuit may include a plurality of clamping transistors. The clamping circuit may include a plurality of clamping diodes. The switching circuit may include a diode bridge switching circuit.

This invention also features a method of mitigating an acquisition glitch for a switched track-and-hold circuit. The method includes the steps of: applying a representation of an input signal to a plurality of storage devices of a track-and-hold circuit in a track mode, blocking a signal path between the input signal and the plurality of storage devices in a hold mode such that a transition from the track mode to the hold mode causes the storage devices to store a time sample of the input signal, and sensing the differential voltage across the storage devices, and clamping the inputs of the switching circuit to the sensed differential voltage in the hold mode such that the initial condition of voltages across of the switching circuit are approximately identical prior to a hold-to-track transition to mitigate the differential acquisition glitch magnitude.

In another embodiment, the method may further include the step of clamping the inputs of the switching circuit to the sensed differential voltage in the hold mode such that the initial condition of switching transistors of the switching may be approximately identical prior to a hold-to-track transition to mitigate acquisition glitch. The method may include the step of providing a plurality of switched emitter followers. The method may include the step of setting the base voltages of each of emitter followers to a predetermined value to create identical conditions on each base-emitter capacitance of each emitter follower.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section above, conventional T/H circuits often exhibit acquisition glitches in their output waveforms. For example, one conventional T/H circuit utilizes a switched emitter-follower (SEF) to provide high speed signal sampling and signal conditioning with a wide bandwidth that can extend into the microwave bands with good linearity. However, one fundamental problem in the SEF T/H circuit topology may be the presence of the sampled signal voltage on the emitter that produces a signal dependent initial condition on the emitter-follower off-state base-emitter junction voltage during the hold interval. Since the two sides of the differential circuit have opposite polarity signals, this causes the differential SEF transistors to turn back on at slightly different times when the transistors transition from the off-state back to the on-state in the hold-track transition. The imbalance on base-emitter capacitance initial condition and the resulting difference in turn-on times may cause large signal-dependent differential acquisition glitches during the hold-track transition. These large amplitude acquisition glitches can cause problems for downstream A/D converters because the impulsive glitch can cause ringing and settling issues in the A/D converter acquisition which degrades accuracy. Additionally, this problem may be particularly troublesome for dual rank T/Hs where the slave T/H tends to deglitch the master T/H but the glitch of the slave is fully presented to the A/D converter.

Figure 1:
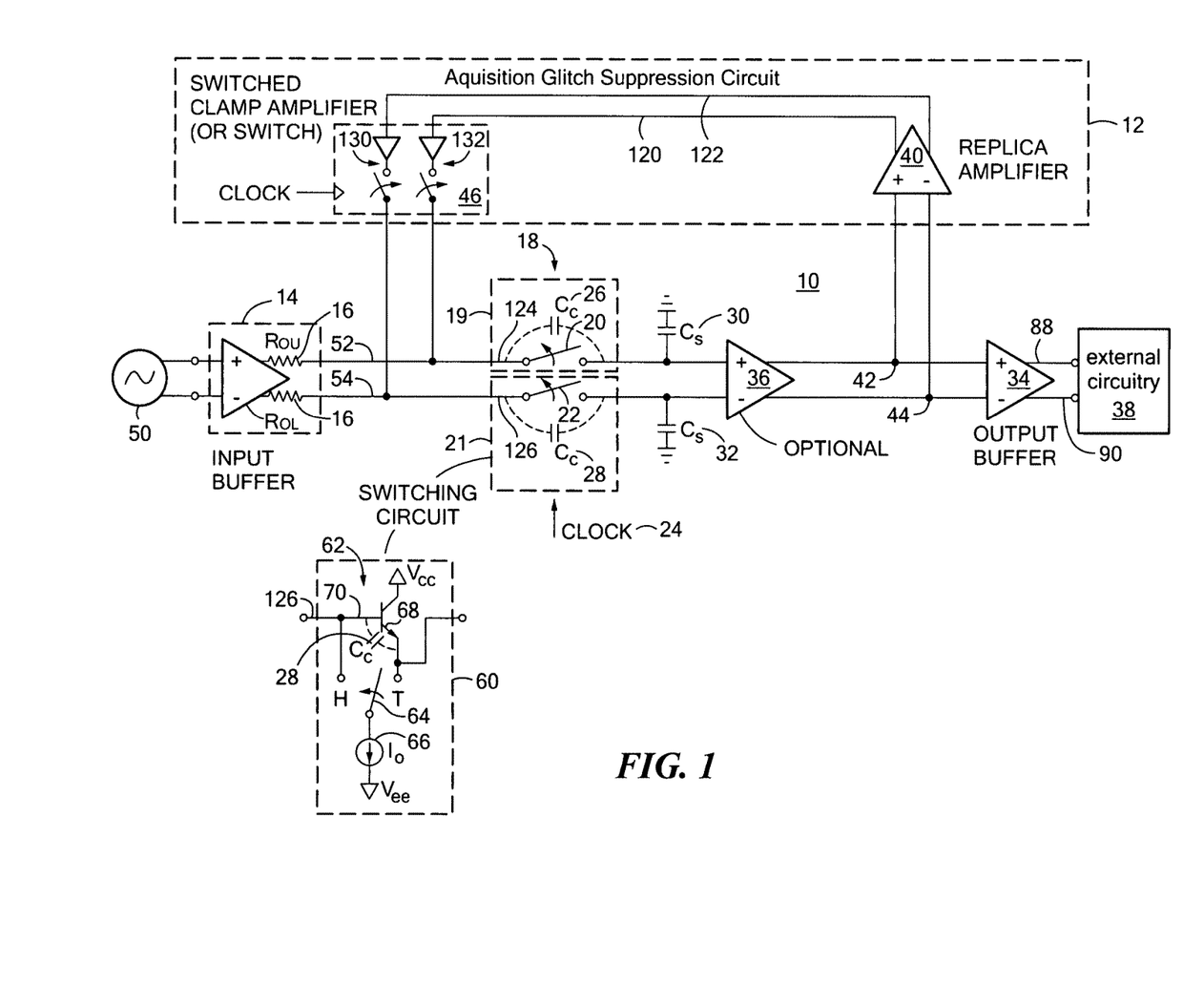
FIG. 1 is a schematic block diagram showing a conventional switched track-and-hold circuit with acquisition glitch suppression in accordance with one embodiment of this invention.

There is shown in FIG. 1 one embodiment of switched track-and-hold circuit (T/H) 10 with acquisition glitch suppression circuit 12 of one embodiment of this invention. In this example, T/H circuit 10 is a conventional SEF T/H which is known. See e.g., U.S. Pat. Nos. 5,298,801 and 6,954,168, all of which are incorporated by reference herein. As used herein, a track-and-hold circuit means a device that samples an analog voltage from an external source during a first tracking mode and maintains a relatively constant representation of that sampled voltage in one or more storage devices during a hold state. Acquisition glitch suppression circuit 12 mitigates or reduces the acquisition glitch magnitude, as discussed in further detail below.

In this example, T/H circuit 10 includes differential input buffer amplifier 14 having an output impedance which is preferably specifically designed to the value $R_{OU}$, $R_{OL}$-16, discussed in further detail below. Input buffer 14 drives high speed switching circuit 18 with switches 20 and 22. Switches 20 and 22 are typically high speed electronic switching devices, as known in the art. Switching circuit 18 is preferably clock-controlled, as indicated at 24. In this example, parasitic coupling capacitance across the switches 20 and 22 is represented as Cc-26, Cc-28, respectively. This undesired capacitance is not intentionally created by SEF T/H circuit 10, but occurs in virtually all switches due to the physical and electrical limitations of the devices used to construct switch 10. The output of switches 20, 22 drive storage devices, capacitances Cs-30, Cs-32, respectively, and output buffer amplifier 34 and/or optional buffer amplifier 36.

Differential output buffer amplifier 34 (and/or the optional buffer amplifier 36) buffers the high impedance signal storage node formed by capacitances Cs-30, Cs-32 with minimal electrical loading to provides a low output impedance, e.g., about 50 ohms, or similar low output impedance, to drive the relatively low impedance of external circuitry 38.

Acquisition glitch suppression circuit 12 of one embodiment of this invention preferably includes differential replica amplifier 40 and switched clamping circuit 46. As will be discussed in further detail below, acquisition glitch suppression circuit 12 reduces or mitigates acquisition glitch.

The basic operation of the T/H circuit 10 without acquisition glitch suppression circuit 12 will first be discussed to show the origin of the acquisition glitch in conventional T/H circuit 10. Thereafter, acquisition glitch suppression circuit 12 will be discussed.

In one exemplary operation, input buffer amplifier 14 is responsive to input signal 50, e.g. an analog input signal, and converts input signal 50 to a differential output signal. Input buffer amplifier 14 also buffers input signal 50 and provides controlled resistive output impedance typically specifically designed to the value $R_{OU}$-16, $R_{OL}$-16. In the microwave design regimes discussed herein, T/H circuit 10 preferably operates over a very large signal bandwidth. Typical circuit bandwidths of T/H circuit, in accordance with one embodiment of this invention, may span DC to about 20 GHz frequency, which may be suitable for use in microwave applications. In this example, a typical value for $R_{OU}$-16, $R_{OL}$-16 may be about 130 ohms, although similar low values may be used as known by those skilled in the art. In track mode, closing switches 20 and 22 connects the differential output signal on lines 52 and 54 to capacitances Cs-30 and Cs-32, respectively. The transition of T/H circuit 10 to hold mode and associated signal sampling is initiated by rapidly opening switches 20 and 22. This results in signal sampling such that the value of the signal on the storage capacitances Cs-30 and Cs-32 at the instant the switches 20 and 22 open is "frozen" and essentially held constant on each of capacitances Cs-30 and Cs-32 during the duration of the hold-mode interval. Externally applied clock signal 24 is preferably used to determine the exact instances at which the T/H circuit 10 samples the signal and the time when switches 20 and 22 close again and the T/H circuit 10 transitions back to track-mode.

T/H circuit 10 is preferably an ultra-broadband, high speed T/H circuit which can achieve low distortion and broad bandwidth. This requires the total capacitance on the storage nodes to be very small. Typical values for the total storage capacitance in microwave T/Hs are of the order of about 300 fF. This storage capacitance is typically created by the combination of a small physical capacitor, e.g., Cs-30, Cs-32, the input capacitance of the output buffer amplifier 34 (and/or optional buffer 36), the output capacitance of switches 20 and 22, and the parasitic wiring capacitance of the integrated circuit. In order to maintain reasonable sample hold time, both the DC and AC resistive loading caused by the input impedances of the output buffer amplifier 34 (and/or optional buffer 36) need to be minimized. Hence, output buffer amplifier 34 (and/or optional buffer 36) has low input DC bias current and very high AC impedance.

Conventional high speed switching circuit 18 for T/H circuit 10 may include a switched emitter follower (SEF) circuit, a diode bridge circuit, or similar type high speed switching circuit. In one example, switching circuit 18 is configured as a SEF circuit. In this example, switching circuit 18 includes two differential half-circuits 19 and 21. Differential half-circuit 19 includes switch 20 and differential half-circuit 21 includes switch 22. For example, switched emitter follower circuit 60 may be depicted to represents differential half-circuit 21 of switch 22 of switch 18 configured as an SEF. Switched emitter follower circuit 60 preferably includes NPN bipolar transistor 62 and clock-controlled switch 64 which connects current source 66 (with a current of $I_0$) to either emitter 68 of transistor 62 or to base terminal 70. In track-mode, current source 66 is connected by switch 64 to emitter 68 so that transistor 62 operates as a unity gain emitter follower transistor stage. In this track-mode, an amplified version of the input signal is impressed on the storage capacitances. In this example, for switched emitter follower circuit 60, an amplified version of the input signal on line 54 is impressed on the storage capacitance Cs-32. When the clock forces the T/H circuit 10 to transition to hold-mode, the current source $I_0$ is abruptly disconnected from emitter 68 and connected to the base terminal 70. This current flows through the Rol-16 output impedance by line 54 of the input buffer amplifier 14 and causes a voltage drop across the output resistance of Rol-16 that creates a fast negative-going common mode voltage transition on base terminal 70 of SEF transistor 62 that rapidly shuts off transistor 62. The result is emitter 68 is essentially electrically floated such that the input signal value at the time of the track-hold transition is frozen on capacitance Cs-32 and the input buffer amplifier output signal on line 54 is also blocked from the storage capacitance Cs-32 by the off-state transistor. The same structure and operation is used for differential half-circuit 19. Differential output buffer amplifier 34 senses the voltage on storage capacitances Cs-30 and Cs-32 and reproduces the difference of the held-sample voltages on outputs 88 and 90 which drive the desired external circuitry 38, such as an analog-to-digital converter, or similar type device.

The origin of the acquisition glitch in T/H circuit 10 without the acquisition glitch suppression circuit 12 is now discussed. During hold-mode, the signal on the storage capacitances Cs-30, Cs-32 is stored as the value at the instant of the track-to-hold transition and it soon bears little relation to value of input signal 50 as the hold mode time progresses because input signal 50 is typically still changing value according to its time varying behavior. Hence, at the time instant just prior to the hold-track transition, when the T/H circuit 10 is just about to go into track-mode again, there is a somewhat arbitrary voltage across the switch coupling capacitances Cc-26 and Cc-28 since this voltage depends on the difference between the stored signal sample voltage in capacitances Cs-30 and Cs-32 (at the last track-hold transition time) and the particular value of the voltage of input signal 50 present at the input to switches 20 and 22 during the hold-track transition. In the example where switch 18 is a SEF, this capacitance, capacitances Cc-26 and Cc-28, corresponds to the transistor base-emitter junction capacitance plus any parasitic wiring capacitance. See, e.g., Cc-28 shown in switched emitter follower circuit 60 for differential half-circuit 21. As a result, the initial condition of the transistor base-emitter voltage, which is the voltage across the capacitances Cc-26, Cc-28, is different for the negative differential half-circuit-(in this example, Cc-28 for differential half-circuit 21) and the positive differential half-circuit (in this example, Cc-26 for differential half-circuit 19) at the moment of the hold-track transition. The difference in base-emitter capacitances Cc-26, Cc-28 initial conditions on the two differential half-circuits 19 and 21 prior to the hold-track transition is created by both the varying stored sample voltage and the varying input signal voltage.

Right after the hold-track transition, in this example, referring to switch 22 configured as SEF circuit 60, current source $I_0$-66 is reconnected to emitter 68 of the SEF transistor 62 by switch 64. Current source $I_0$-66 attempts to turn SEF transistor 62 on by pulling current through emitter 68. In addition, at this point in time, the voltage drop that was created by the current $I_0$ through input buffer amplifier output resistance Rol-16 is nulled and the voltage at the base 70 of SEF transistor 62 rises to help turn SEF transistor 62 back on. However, the voltage across the base-emitter capacitance Cc-28 cannot change instantaneously and the transistor base-emitter junction takes a finite amount of time to charge up to the voltage value, e.g., about 0.85V in SiGe bipolar technology, associated with the on-state of the base-emitter diode junction. While this charging process takes place, but before SEF transistor 62 turns back on to supply current to the current sink $I_0$-66, current source $I_0$-66 is pulling charge from the storage capacitor Cs-32 and rapidly discharging it. A similar operation occurs for the differential half-circuit 19. Since the voltage initial conditions on the base-emitter junction capacitances Cc-26, Cc-28 are different for differential half-circuits 19 and 21, the time it takes to achieve transistor turn-on is also different for the differential circuit half circuits 19 and 21.

For example, consider the worst case conditions for the initial condition base-emitter voltage asymmetry. This occurs when the stored sample is one polarity of full scale signal at the track-hold transition with the opposite polarity of full scale signal during the hold-track transition. Storage capacitance Cs-30 with positive polarity full scale signal as a stored sample value causes an additional negative bias on the base-emitter voltage whereas the storage capacitance with negative polarity signal as a stored sample, in this example, storage capacitance Cs-32, causes an additional positive bias on the base-emitter voltage. Likewise, the base terminal with negative input signal polarity (in this example, the transistor for switch 20, not shown) creates a negative bias on the base-emitter voltage and the base terminal with positive input signal polarity (in this example, base terminal 70 for transistor 62) creates a positive bias on the base-emitter voltage. The SEF transistor with the less positive base-emitter voltage initial condition, in this example, the SEF transistor for negative differential half-circuit 19, prior to the hold-track transition will take longer to turn on than the SEF transistor with the more positive base-emitter voltage initial condition, in this example the SEF transistor 62 for positive differential half-circuit 21. Since the current source $I_0$ is discharging the storage capacitances Cs-30 and Cs-32 in the very small time interval between the hold-track transition and the time at which the SEF transistors actually turn on, a negative-going voltage glitch is introduced on each differential half-circuit storage capacitance Cs-30, Cs-32 that is related to the initial condition voltages across the base-emitter capacitances Cc-26, Cc-28 at the moment of the hold-track transition. The magnitude and timing differences of these glitches on each differential half-circuit creates a differential T/H output glitch with polarity and amplitude that depend on the signal history at the sample time and the current signal conditions at the moment of hold-track transition.

As discussed above, T/H circuit 10 is a conventional switched emitter follower (SEF) T/H which is well known in the art. An improved clamp diode SEF T/H circuit is disclosed in the '168 patent cited supra. As disclosed therein, the '168 patent utilizes voltage clamping of the SEF transistor bases to a fixed voltage during the hold-mode. This essentially eliminates the differential signal voltage on the bases during hold-mode. A key benefit of this clamp structure may be that it greatly reduces the second order effect of hold-mode signal feed-through in the T/H circuit 10. Another advantage of voltage clamping the SEF transistor bases is that it may eliminate the current signal state at the moment of the hold-track transition as a source of voltage variation in the initial condition of the base-emitter capacitance Cc, e.g., Cc-26 and Cc-28. This may reduce the maximum possible signal-induced initial condition voltage variation across Cc-26, Cc-28 by a factor of two in the worst case condition. However, even with this improved circuit topology, there will still be a sample voltage-induced variation to the initial condition of base-emitter capacitances Cc-26, Cc-28, prior to the hold-track transition, due to the difference in stored voltages on the capacitances Cs-30, Cs-32.

Figure 2:
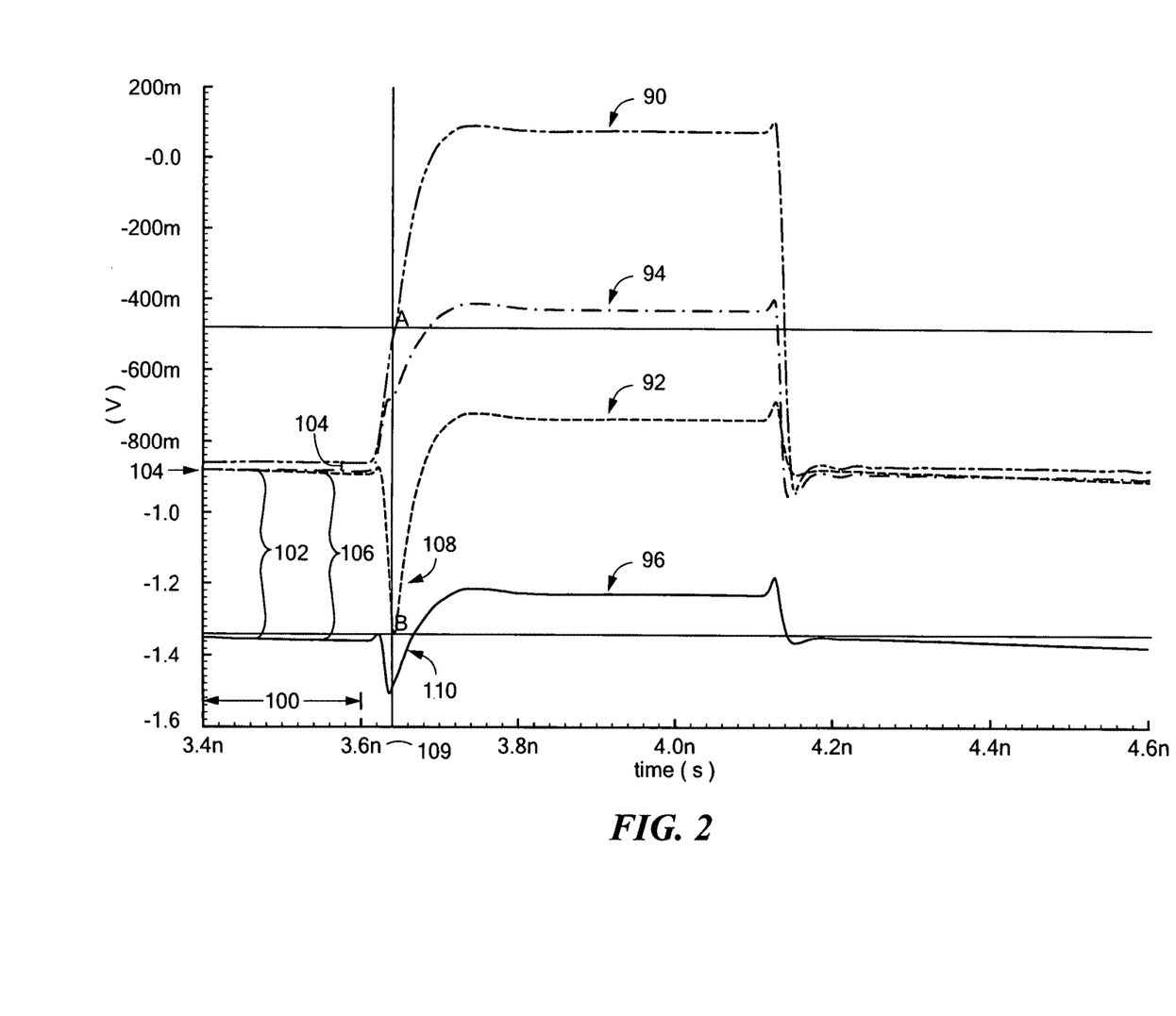
FIG. 2 shows exemplary waveforms of a switched emitter follower (SEF) T/H shown in FIG. 1 with acquisition glitches.

FIG. 2 shows an example of the simulated SEF transistor base and emitter voltage waveforms for differential half-circuits 19 and 21 of one embodiment of this invention during a hold-track transition for SEF T/H circuit 10, FIG. 1, that has been diode-clamped as disclosed in the '168 patent without acquisition glitch suppression circuit 12. For positive differential half-circuit, in this example the differential half-circuit 19, trace 90, FIG. 2, shows the base voltage waveform for the SEF transistor and trace 92 shows the corresponding emitter voltage for the SEF transistor. For the negative differential half-circuit, in this example the differential half-circuit 21, trace 94 shows the base voltage waveform for SEF transistor 62, FIG. 1, of differential half-circuit and trace 96, FIG. 2, shows the corresponding emitter voltage for SEF transistor 62. In the interval about from 3.4 ns to about 3.62 ns, indicated at 100, T/H circuit 10, FIG. 1, is in hold-mode having stored a positive signal near full scale of approximately 0.45 V. This differential stored voltage is shown in FIG. 2 as the voltage difference between emitter voltage traces 92 and 96, indicated at 102. In this same time interval, the diode clamps are active and drive the difference in base voltages shown by the traces 90 and 94 to nearly identical values indicated at 104. At the end of the hold-mode at 3.62 ns, the base-emitter voltage initial condition for positive differential half-circuit 19, FIG. 1, in this example trace 90, FIG. 2, minus trace 92 is about 0 V, indicated at 104, while the initial condition for negative half-circuit 21 is about 0.45V, trace 94 minus trace 96, indicated at 106.

Figure 3:
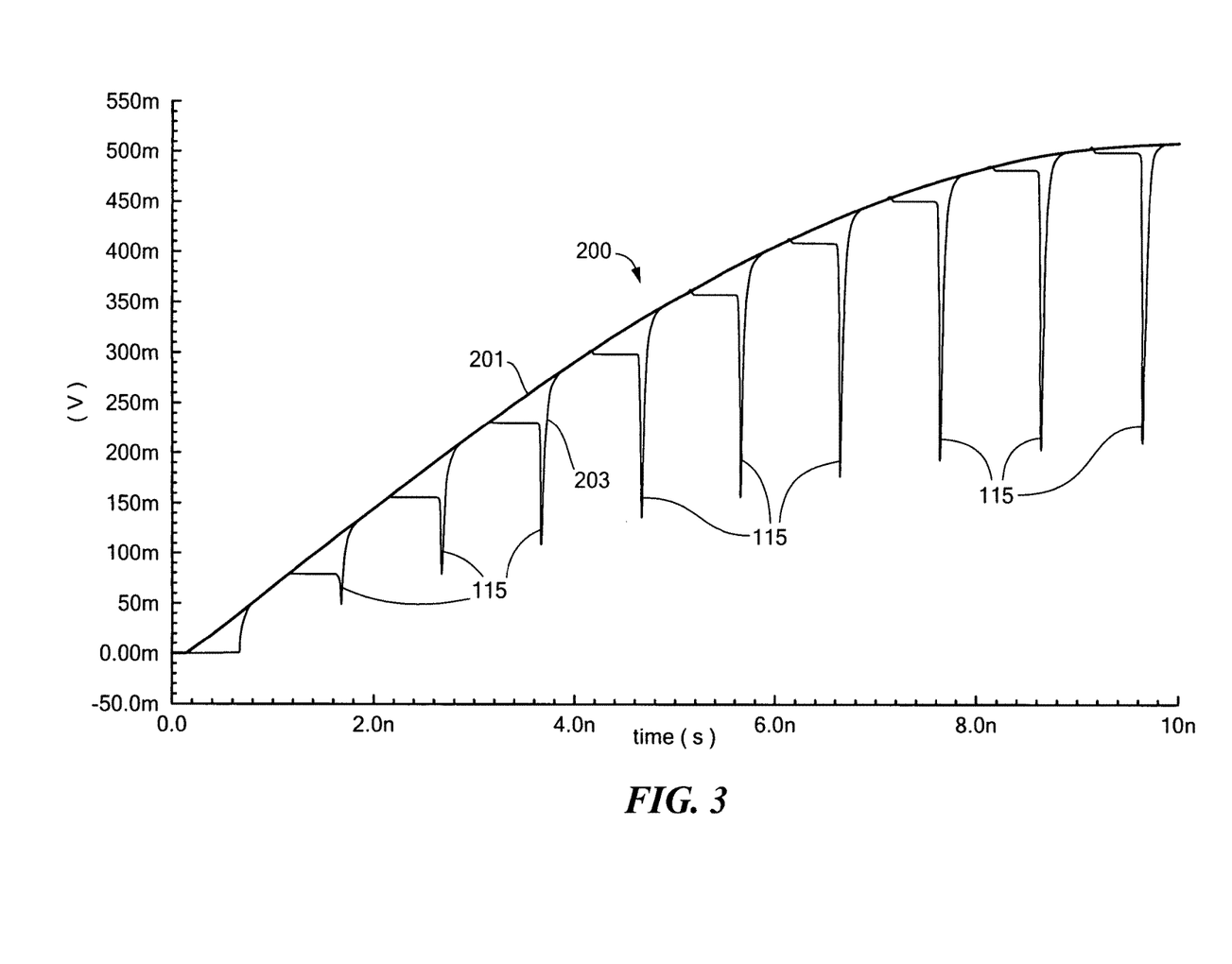
FIG. 3 is a plot showing an example of differential waveform output by another conventional SEF T/H exhibiting acquisition glitches.

When the hold-track transition occurs, for this example, at approximately 3.62 ns indicated at 109, the base voltages rapidly rise because the current $I_0$ is no longer connected to the base and the common-mode voltage drop across $R_{OU}$-16, $R_{OL}$-16, FIG. 1, which was keeping the SEF transistors off, is nulled. This common mode base voltage rise attempts to turn the SEF transistors for switches 20 and 22 back on. However, the transistors take a finite time to turn back on because their base-emitter junction capacitance needs to be charged back up. Therefore, there is a small interval of time where the current sources for differential half-circuits 19 and 21 are connected to the emitters but the transistors are not on yet. This causes the current to rapidly discharge the storage capacitances Cs-30, Cs-32. This results in a negative going voltage spike on each differential half-circuit storage capacitance Cs-30, Cs-32 that reaches its peak negative value at approximately the time when the base-emitter voltage of the SEF transistors reaches about 0.8 V and the transistors turn back on. These voltage spikes, referred to as acquisition glitches, are shown at 108, FIG. 2, for differential half-circuit 19, FIG. 1, and 110 for differential half-circuit 21. However, voltage spike 108 is larger than the voltage spike 110 because the base-emitter voltage initial condition of the SEF transistor of differential half-circuit 19 just prior to the transition causes a reverse bias perturbation which delays the transistor turn-on relative to negative differential half-circuit 21. This can be observed by the small difference in delay between the start of the hold-track transition and the peak of spikes 108 and 110. The net result of the signal induced base-emitter voltage initial condition asymmetry is that acquisition glitches 108 and 110 of differential half-circuits 19 and 21 have different amplitudes and slightly different delays. This results in a relatively large differential output glitch for the output of T/H circuit 10 as shown in FIG. 3. This glitch is often referred to as the acquisition glitch because the large transient signal can interfere with the accurate acquisition of the input signal in track-mode right after the hold-track transition.

An example of the differential voltage waveform at the storage capacitance node in a high speed clamp diode T/H topology disclosed in the '168 patent cited supra is shown in FIG. 3. In this example, curve 201 shows the steady state track mode signal, and curve 203 shows the TH mode clocked signal. Acquisition glitches 115 are shown which result from repeated sampling at 1 GHz sample rate for the input signal voltage ramp created by a slowly varying sinusoidal signal at 25 MHz frequency. Acquisition glitches 115 tends to be proportional to signal level and are in the opposite polarity of the input signal for the clamp diode T/H circuit where the differential signal voltage at the SEF bases is driven to zero by the clamps so that the only signal variation on the hold-track base-emitter voltage initial conditions is caused by the storage capacitor signal. Acquisition glitches 115 can slow acquisition time down in both the T/H and any downstream A/D converter because the large impulsive amplitude glitch has broad spectral content and can excite circuit electrical ringing and other transient phenomena which require additional time for settling.

As discussed above, acquisition glitch may be caused by the varying initial conditions on the base-emitter capacitance Cc-26, FIG. 1, of the SEF transistor of differential half-circuit 19 and base-emitter capacitance Cc-28 of the SEF transistor of differential half-circuit 21 at the start of the hold-track transition. Moreover, this varying initial condition can be caused by both the varying stored signal sample voltage at the emitters of the SEF transistors as well as the varying input signal voltage some time later at the hold-track transition time. The glitch can be mitigated if the base voltages of the SEF transistors are forced to have values which create identical initial conditions on the base-emitter capacitance of both differential half-circuits 19 and 21, independent of the signal.

In accordance with one embodiment of this invention, acquisition glitch suppression circuit 12, FIG. 1, preferably includes differential replica amplifier 40 coupled to switching circuit 18 by nodes 42 and 44. Differential replica amplifier 40 senses the differential voltage across storage devices, e.g., storage capacitances Cs-30 and Cs-32, and feeds back a replica of the sensed differential voltage by lines 120 and 122 to the SEF transistor bases of differential half-circuits 19 and 21 during the hold-mode. However, this feedback must only be applied during the hold-mode since application of the positive feedback during track-mode would interfere with track-mode operation and create undesired loading of input buffer amplifier 14, as well as potential instability and frequency response perturbations. Therefore the replica voltage must be switched to the inputs of the SEF transistors only during hold-mode such that during track-mode there is no significant loading or perturbation of the input buffer amplifier output signal.

Clamping circuit 46 preferably clamps inputs 124, 126 of switching circuit 18 to the sensed differential voltage between Cs-30 and Cs-32 in the hold mode such that the initial condition of the SEF transistors of differential half-circuits 19 and 21 are approximately identical prior to a hold to track transition to mitigate acquisition glitch magnitude. Clamp circuit 46 preferably includes clamp transistors 130 and 132 which incorporate a common mode voltage as well as the additional differential voltage from replica amplifier 40 by lines 120, 122 in order to achieve a switching operation which clamps the inputs of the SEF transistors of differential half-circuits 19 and 21 to the differential voltage sensed on the storage capacitors Cs-30, Cs-32 while in hold mode while effectively producing an open circuit or high impedance in track-mode. Preferably, clamp circuit 46 includes transistor clamps, but diode clamps may also be used. The structure and operation acquisition glitch suppression circuit 12 is discussed in greater detail below.

Figure 4A:
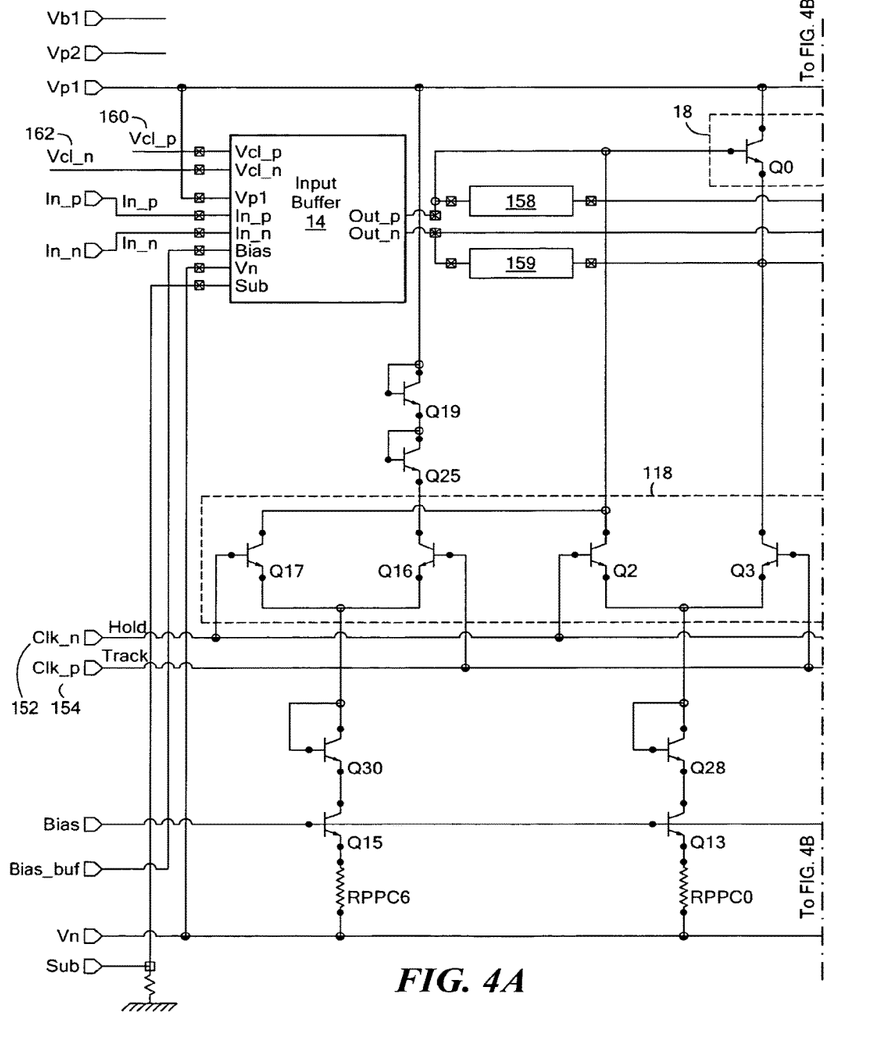
FIG. 4 is a circuit diagram showing in further detail the primary components of one example of the T/H circuit and the acquisition glitch suppression circuit of this invention shown in FIG. 1.
Figure 4B:
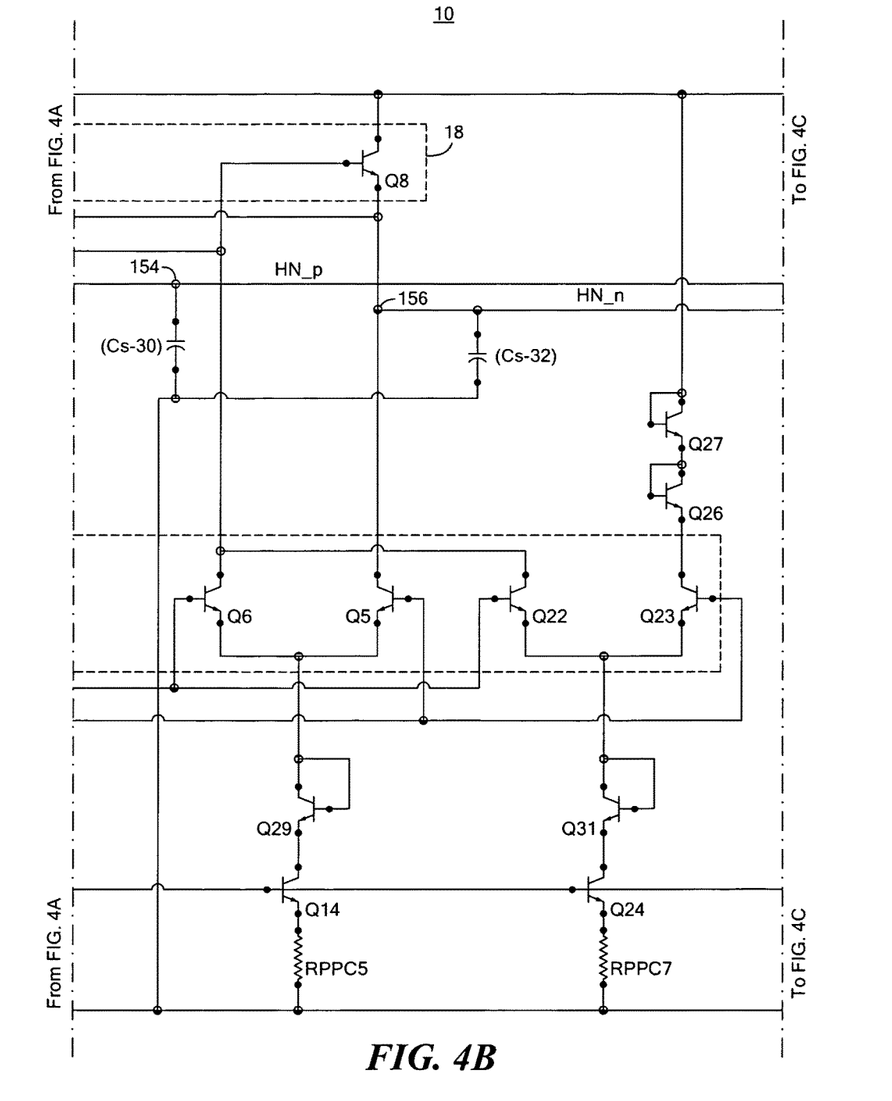
Figure 4C:
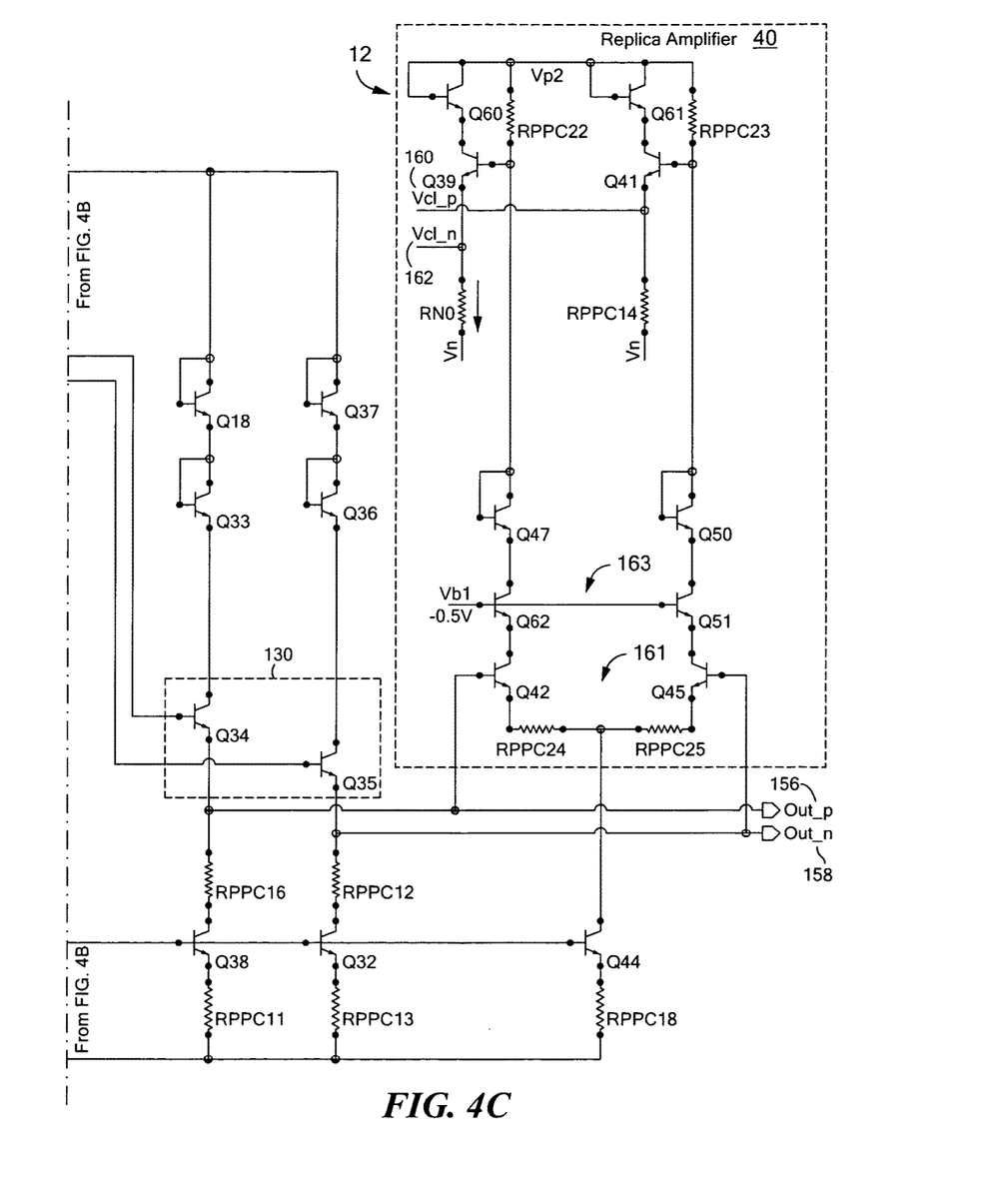

FIG. 4 shows in further detail an example of T/H circuit 10, FIG. 1, configured as a switched emitter follower T/H and the structure of acquisition glitch suppression circuit 12. In this example, switch 18, FIG. 1, includes transistor Q0, FIG. 4, where like parts have been given like numbers, and transistor Q8, FIG. 1, which are the switched emitter follower switches for differential half-circuits 19 and 21. Differential current switch 118, FIG. 4, includes transistors Q2/Q6, Q3/Q5, Q17/Q22, and Q16/Q23 which route bias current to the emitters or bases of the SEF transistors Q0/Q8, depending on the applied clock state at the terminals Clk_n and Clk_p, indicated at 152, 154, respectively. Current source transistors Q13, Q14, Q15, and Q24 supply current to the current switches. Buffer 130 includes transistors Q34/Q35 which form emitter follower stages to buffer the sensitive low capacitance hold-nodes 154, 156 at the emitters of Q0/Q8 from the downstream circuitry. Circuits 158 and 159 emulate the off-state base-emitter capacitance of the SEF transistors Q0/Q8 to cancel signal feed-through in the switch off-state.

The output of the buffer 130 drives the output terminals Out_p and Out_n, indicated at 156, 158, and acquisition glitch suppression circuit 12, FIGS. 1 and 4. Acquisition glitch suppression circuit 12 includes replica amplifier 40. Replica amplifier 40 preferably includes differential amplifier 161, FIG. 4, which preferably includes transistors Q42/Q45, cascode amplifier 163 with transistors Q62/Q51, level shifting diodes Q47/Q50, and load resistors RPPC22/RPPC23. The output of replica amplifier 40 is buffered by emitter followers Q39/Q41 to produce the replica/clamp voltages at terminals Vcl_p and Vcl_n, indicated at 160, 162. These voltages are fed back to the clamp transistors CC-Q8/CC-Q7, FIG. 5 within input buffer circuit 14 by lines 164 and 166.

Figure 5A:
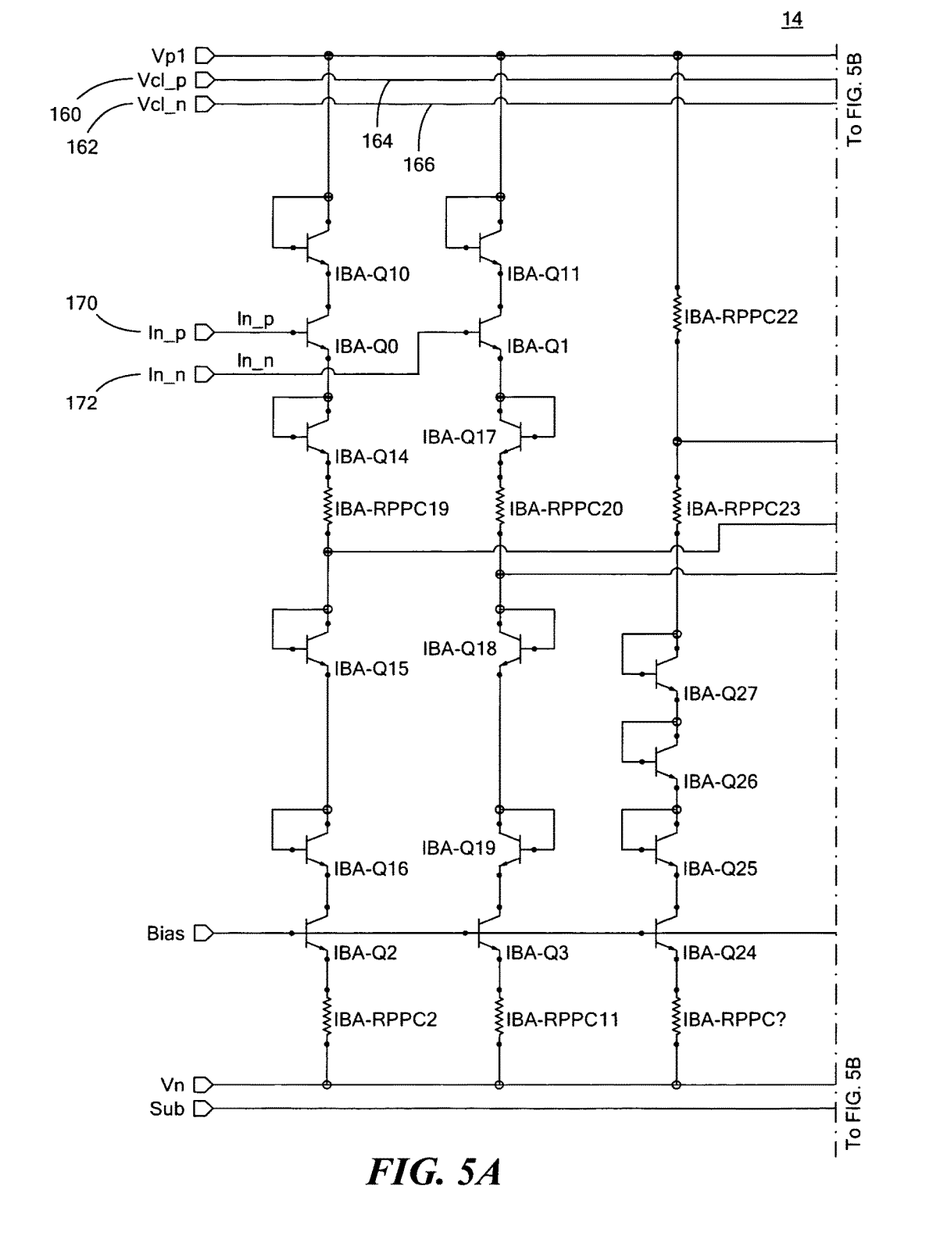
FIG. 5 is a circuit diagram showing in further detail the structure of the input buffer and the clamping circuit of the T/H and the glitch suppression circuit shown in FIG. 1.
Figure 5B:
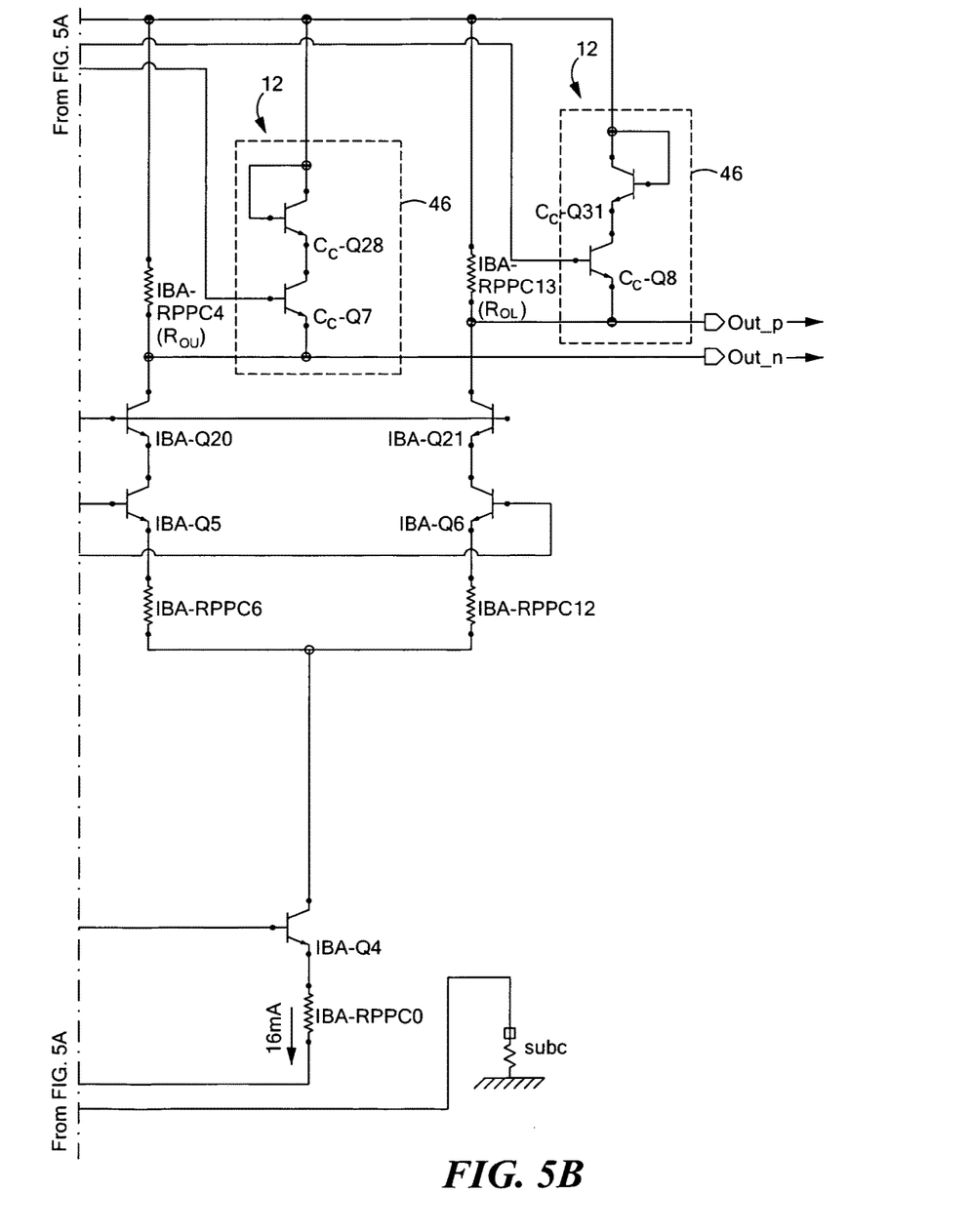

Input buffer 14, FIGS. 1 and 5 preferably includes transistors IBA-Q0/IBA-Q1, FIG. 5, which form emitter follower buffers and IBA-Q14/IBA-Q17 which are level shifting diodes. IBA-Q15/IBA-Q18 and IBA-Q16/IBA-Q19 are voltage dropping diodes. IBA-Q2 and IBA-Q3 form current sinks for bias of the input stages. IBA-Q5/IBA-Q6 form a second stage differential amplifier with IBA-Q20/IBA-Q21 cascode devices and load resistors IBA-RPPC4/IBA-RPPC13 ($R_{OL}$-16, $R_{OL}$-16, FIG. 1). As discussed above, glitch suppression circuit 12, FIGS. 1 and 4, includes clamp circuit 46. In this example, clamp circuit 46 is part of input buffer 14, FIG. 5, and preferably includes clamp transistors CC-Q7/CC-Q8, with base voltages fed through the terminals Vcl_p/Vcl_n by the replica circuit 40, FIG. 4, via lines 164, 166, as discussed above. Additional details of a diode clamped SEF T/H operation are disclosed in the '168 patent cited supra. The circuit topology discussed in accordance with one or more embodiments of this invention may be similar to what is disclosed in the '168 patent but preferably incorporates clamp transistors instead of clamp diodes driven by the acquisition glitch suppression circuit 12.

In one exemplary operation, in track-mode, differential current switch transistors Q3/Q5, FIG. 4, and Q16/Q23 are "ON" while transistors Q2/Q6 and Q17/Q22 are "OFF," thus biasing the emitter-followers Q0/Q8 in their normal quiescent current region. This transmits the input signal to the hold nodes (the emitters) of the Q0/Q8 emitter-followers. In hold-mode, the current switches cut off the current to the Q0/Q8 emitter-followers, floating the emitters and hence hold capacitor nodes 154 and 156. At the same time, the current switches sink current at the bases of Q0/Q8 helping to discharge the base-emitter junctions rapidly so that the "ON" to "OFF" transition of the Q0/Q8 transistors is very fast. The sink current is also pulled through the output impedance of input buffer amplifier 14, FIGS. 1 and 5, and the resulting voltage drop on the bases insures that Q0/Q8, FIG. 4, are completely turned off.

The differential signal on the SEF emitters Q0/Q8 is filtered slightly by hold node capacitances C0 and C5, corresponding to Cs-30, Cs-32, FIG. 1, respectively. As discussed above, additional hold node capacitance is created by transistor structure capacitances and parasitic wiring capacitance. The hold node signal is buffered by buffer 130 FIG. 4, with Q34/Q35 emitter followers which drive the transistors Q42/Q45 of differential replica amplifier 40. This cascode amplifier provides sufficient differential gain slightly above unity to compensate for the small transfer function losses in the Q39/Q41 emitter follower buffers and clamp transistors CC-Q7 and CC-Q8, FIG. 5, within input buffer amplifier 14. The bandwidth of replica amplifier 40, FIG. 4, is preferably designed to be as broad as possible to provide rapid settling of the replica of the differential hold-node voltage. Current levels and load resistors IBA-RPPC22/IBA-RPPC23, FIG. 4, are also designed to provide the proper common-mode clamp transistor voltage for the terminals Vcl_p and Vcl_n so that the transistor clamps Cc-Q7 and Cc-Q8 in input amplifier 14 operate at the proper common mode level. This common mode level insures clamp transistors CC-Q7 and CC-Q8 are active during the hold-mode but inactive during the track-mode. This allows minimal loading of input buffer amplifier 14 output by the clamp transistors CC-Q7 and CC-Q8 during track mode thus allowing wide bandwidth operation with minimal frequency response-degrading capacitance loading the signal path.

Referring to input buffer amplifier 14, FIG. 5, the input differential signal In_p, In_n, indicated at 170, 172, is buffered by emitter follower transistors IBA-Q0/IBA-Q1 and level shifted downward through diodes IBA-Q14/IBA-Q17. This signal is then applied to differential amplifier IBA-Q5/IBA-Q6 and cascoded by IBA-Q20/IBA-Q21. The output load for this amplifier preferably includes the parallel combination of the load resistors IBA-RPPC4 and IBA-RPPC13 and the impedance of clamp transistors CC-Q7/CC-Q8 emitter. The common mode level of the Vcl_p and Vcl_n replica voltages on lines 164, 166 is preferably designed such that the clamp transistors CC-Q7/CC-Q8 are "OFF" during the track-mode. During the T-H transition and in hold-mode, current from Q2, FIG. 4, Q17, Q6, Q22 current switches in T/H circuit 10 is pulled through the IBA-RPPC4($R_{OU}$)/IBA-RPPC13($R_{OL}$) resistors, FIG. 5, loads causing a transient voltage drop in the Out_p/Out_n nodes. As the voltage goes rapidly downwards on these nodes the common-mode base-emitter voltage on clamp transistors CC-Q7/CC-Q8 increases to the point that clamp transistors CC-Q7/CC-Q8 rapidly turn on, clamping the Out_p/Out_n nodes to approximately one base-emitter voltage drop (Vbe) under the base clamp voltages Vclp and Vcl_n. In the "ON" state, the impedance looking into the emitters of the clamp transistors CC-Q7/CC-Q8 is very low and the net AC impedance on the Out_p/Out_n terminals is driven to a very low value. This radically reduces the gain of the IBA-Q5/IBA-Q6 differential amplifier and causes a very large signal attenuation. The net effect is that during the hold-mode the undesired signal feed-through is radically reduced because there are two independent stages of signal attenuation: 1) the attenuation of the IBA-Q0/IBA-Q5 differential amplifier, driving the low impedance clamp load, and 2) the SEF switch OFF-state signal attenuation. The combination of these two stages of attenuation may result in very high hold-mode signal isolation even at high microwave frequencies. This maintains high accuracy in the held samples over a broad bandwidth. These are the same operational principles and properties discussed in the '168 patent cited supra.

For SEF T/H circuit 10, FIG. 4, the turn-off of the SEF transistors Q0/Q8 during the hold-mode by the negative-going base voltage turn-off transient results in a small positive, or even reverse bias, across the base-emitter junctions. This turns the transistors Q0 and Q8 off, disabling the transfer function of the emitter followers formed by these transistors. This hold operation results in a differential signal on the hold-capacitance and hence on the emitters of SEF transistor Q0 and Q8. This creates a signal-dependent SEF off-state base-emitter capacitance bias that serves as the initial condition for the H-T transient transition. This signal dependent initial condition for the H-T transition occurs regardless of whether the SEF T/H is a conventional unclamped design, such as described in '801 patent cited supra, or the diode clamped SEF T/H disclosed in the '168 patent cited supra, because the signal storage on the hold-capacitance fundamentally affects the SEF emitter voltages.

For the case of the diode clamped circuit T/H circuit, such as disclosed in the '168 patent which maintains the bases of the SEF transistors at the clamped fixed voltage, if the signal on the hold capacitor is positive, making the SEF emitter more positive, then the base-emitter bias is reduced. If the signal on the hold capacitor is negative then the base-emitter bias is increased. Since the H-T emitter voltage transition is in the positive direction, this signal dependence results in the positive emitter node going into track mode later than the negative emitter node, creating an acquisition glitch which is always the opposite polarity of the held signal prior to the H-T transition. Because the base-emitter voltage initial condition differs between the two differential half-circuit circuits (by up to the value of the peak to peak differential signal swing on the hold-nodes) then the SEF transistors are usually at different voltages during the transition. They also turn on (and arrive at track-mode) at different times during the hold-track transition creating a large turn-on asymmetry and large delta-function shaped glitches in the differential hold-node voltage. As discussed above, this is often referred to as acquisition glitch because it occurs at the beginning of the track-mode when the device is acquiring the input signal and readying itself for the next sample.

Acquisition glitch suppression circuit 12, FIGS. 1, 4, and 5, of one embodiment of this invention mitigates this acquisition glitch by feeding back a replica of the hold-node differential voltage and forcing it onto the bases of the SEF transistors, in this example, the bases of Q0 and Q8, FIG. 4. This insures that the off-state base-emitter voltages of both SEF transistors Q0 and Q8 are maintained at exactly the same value during the hold-mode. More importantly, the base-emitter voltage initial condition at the start of the H-T transition is equal for both transistors Q0 and Q8. When the transition to track-mode occurs this off-state base-emitter voltage, e.g., in the range of about 0 V to about 0.4 V, although any similar voltage may be used, increases rapidly to a forward bias level of approximately 0.85 V. Since the initial voltage conditions on the transistors are identical regardless of signal sample value on the emitters of Q0 and Q8 in hold-node, the two voltages track each other during the transition resulting in nearly identical turn-on times. The differential hold-node voltage is sensed by the Q42/Q45 differential amplifier of replica amplifier 40 with just enough design gain to compensate for the slight transfer function losses in the Q34/Q35 and Q39/Q41 emitter follower buffers, which are typically slightly less than unity gain, and the slight transfer function loss in clamp transistors CC-Q7 and CC-Q8, FIG. 5. The net effect is preferably the AC gain of the acquisition glitch suppression circuit 12 from hold-node to SEF base is preferably designed to be approximately unity. Acquisition glitch suppression circuit 12 is not overly sensitive and slight deviations in gain from unity can be tolerated. For example, if the gain differs from unity gain by 5%, the glitch suppression achieved by acquisition glitch circuit 12 may be about 95% rather than about 100%. This is still very effective in removing the majority of the glitch. The bandwidth of replica amplifier 40 is preferably large enough to allow fast settling of the replica voltage during the hold mode so that the initial condition at the H-T transition is stable and settled. For high speed T/Hs operating with microwave clock rates of up to 4 GS/s, the bandwidth of replica amplifier 40 should be of the order of about 6 GHz or more.

Replica amplifier 40 is preferably active 100% of the time. However the replica signal is only fed back to the bases of SEF Q0/Q8 during the hold mode. This is accomplished by the common mode level switching that occurs in clamp transistors CC-Q7 and CC-Q8, FIG. 5. A typical common mode level of about 0.15 V is preferably established at the clamp voltage driver outputs Vcl_p/Vcl_n, 160, 162 FIG. 4. As discussed above, these outputs connect to the terminals Vcl_p/Vcl_n in input buffer 14, FIG. 5. In track-mode, the common mode level of the input buffer outputs Out_p/Out_n is designed to operate at about 0.060 V. Since these outputs are connected to the emitters of clamp transistors CC-Q7, CC-Q8, FIG. 5, the base-emitter voltage of clamp transistors CC-Q7, CC-Q8 is therefore about 0.15 minus about 0.06 which equals about 0.09 V causing complete turnoff of the clamp transistors CC-Q7, CC-Q8. The residual capacitive load on the output nodes is primarily associated with the clamp transistor base-emitter capacitance in the off-state which is relatively small. This allows a very wide bandwidth to be obtained from the input buffer amplifier.

During hold mode, in this example, about 12 mA of current is switched from the current routing switches shown in FIG. 4 and pulled out of the Out_p/Out_n terminals, FIG. 5. This current initially is sourced during the T-H transition by the resistors IBA-RPPC4 and IBA-RPPC13, thus pulling the voltage of the Out_p/Out_n terminals rapidly downward. If clamp transistors CC-Q7 and CC-Q8 where not present, this voltage would drop by about 1.66V if all the current went through the resistors. However, when the output terminal voltage drops to approximately about −0.65 V level, there is 0.8 V of forward bias on the base-emitter junctions of clamp transistors CC-Q7 and CC-Q8 and they start to turn on allowing a portion of the 12 mA current to flow through them rather than the resistors. Hence, clamp transistors CC-Q7 and CC-Q8 effectively clamp each output terminal to one base-emitter voltage drop (Vbe) beneath the clamp voltage Vcl_p/Vcl_n. The result is the base voltage of SEF transistors Q0/Q8, FIG. 4, is reduced enough to shut them off as required in hold-mode. In addition, the turn-on of the clamp transistors CC-Q7 and CC-Q8, FIG. 5, creates a very low emitter impedance that shunts the AC signal on the Out_p/Out_n terminals, thus shutting down the gain of the IBA-Q5/IBA-Q6 differential amplifier. As discussed above, this creates two independent stages of hold-mode feed-through rejection and retains good accuracy in the held-samples.

Figure 6:
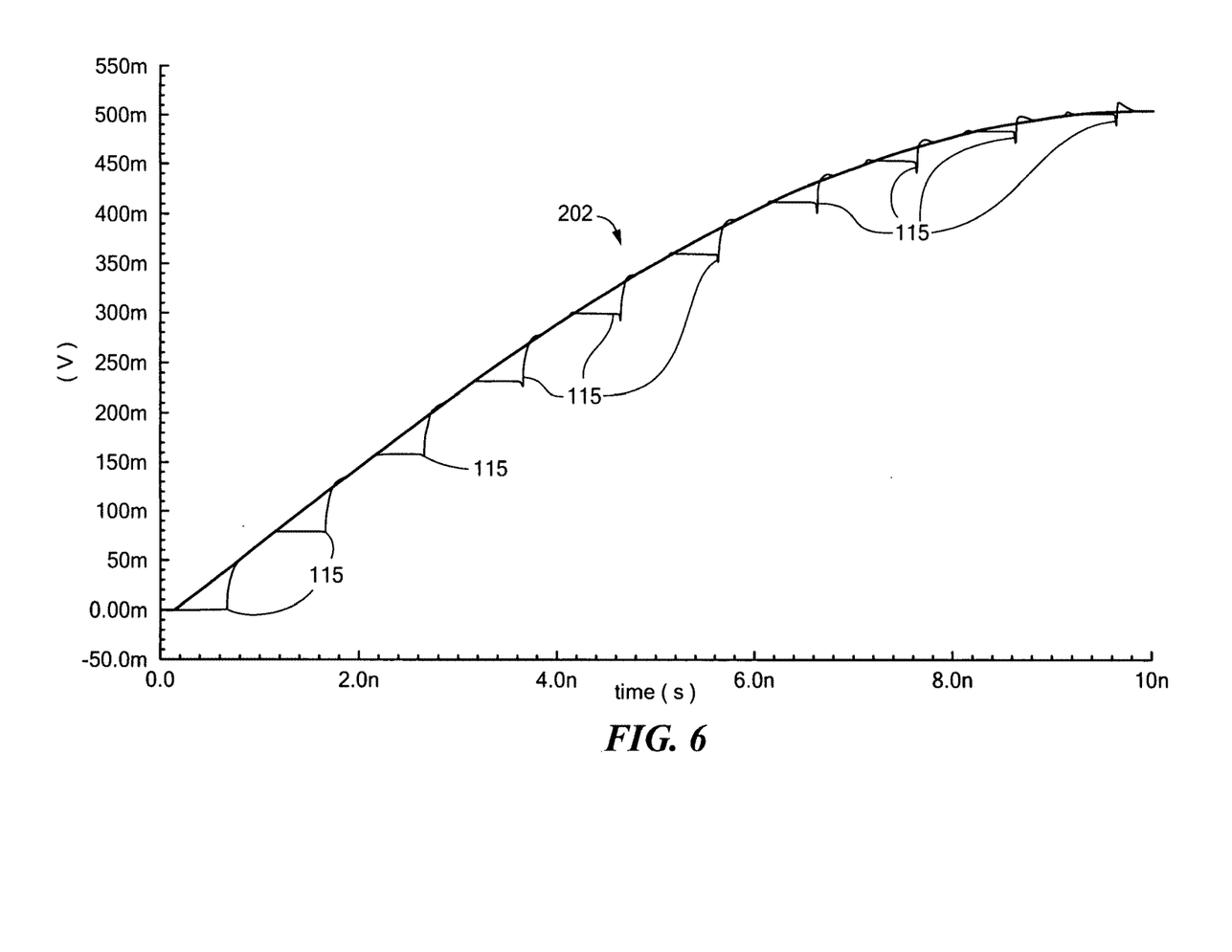
FIG. 6 is a plot showing a differential waveform wherein the acquisition glitch has been effectively mitigated in accordance with the glitch suppression circuit shown in FIGS. 1, 4 and 5.

As discussed above, FIG. 3 shows one example of a simulation of the hold-node differential waveform in a single rank, 5 GHz bandwidth, diode clamped T/H design without acquisition glitch suppression circuit 12 of one or more embodiments of this invention. In this example, acquisition glitches 115 result from repeated sampling at about 1 GHz sample rate for the input signal voltage ramp created by a slowly varying sinusoidal signal at 25 MHz frequency. The simulation includes full IC element structure parasitics and lumped element emulations of key wiring parasitics. In contrast, FIG. 6 shows an example of the same simulated hold-node waveform for a T/H design which is nearly identical to the T/H design simulated in FIG. 5 except T/H circuit 10 includes acquisition glitch suppression circuit 12, FIGS. 1, 4, and 5. As can be seen by a comparison of plot 200, FIG. 3, and plot 202, FIG. 6, there is a significant reduction in the magnitude of acquisition glitches 115. Without acquisition glitch suppression circuit 12, acquisition glitches 115, FIG. 3, are approximately 280 mV at full scale input of 1 Vpp. Utilizing acquisition glitch suppression circuit 12, FIGS. 1 and 4 of one embodiment of this invention, acquisition glitches 115, FIG. 6, may be reduced to about 12 mV. This represents about a 23-fold reduction in amplitude. This reduction may be obtained for glitches with energy spectrum exceeding 20 GHz of spectral content.

Figure 7:
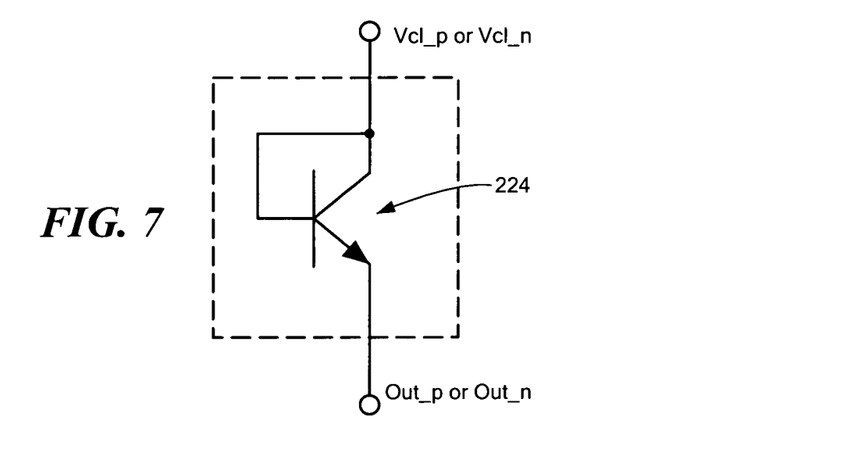
FIG. 7 is a circuit diagram showing one example of diode clamps which may be used instead of the transistor clamps shown in FIG. 5.

Although discussed with reference to FIGS. 1 and 5, acquisition glitch suppression circuit 12 is shown with clamping circuit 46 having clamp transistors CC-Q7 and CC-Q8. This is not a necessary limitation of this invention, as clamping circuit 46 may utilize diode clamps, e.g., diode clamp 224, FIG. 7, which is connected between Vcl_p, Vcl_n and Out_p and Out_n, FIG. 5.

Figure 8:
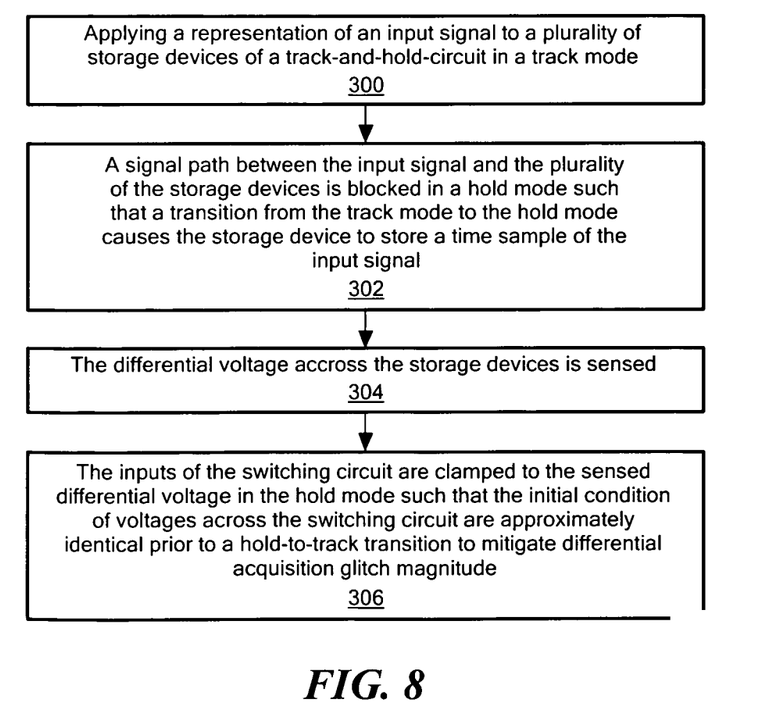
FIG. 8 is a block diagram showing the primary steps with the method for mitigating acquisition glitch for a T/H circuit in accordance with one embodiment of this invention.

In one embodiment, the method of mitigating acquisition glitch for a switched track-and-hold circuit includes applying a representation of an input signal to a plurality of storage devices of a track-and-hold circuit in a track mode, step 300, FIG. 8. A signal path between the input signal and the plurality of storage devices is blocked in a hold mode such that a transition from the track mode to the hold mode causes the storage devices to store a time sample of the input signal, step 302. The differential voltage across the storage devices is then sensed, step 304. The inputs of the switching circuit are clamped to the sensed differential voltage in the hold mode such that the initial condition of voltages across switching circuits are approximately identical prior to a track-and-hold transition to mitigate differential acquisition glitch magnitude, step 306.

Although, as discussed above with reference to FIGS. 1-7, switching circuit 18 with switches 20 and 22 are shown as transistors, this is not a necessary limitation of this invention. The utility of establishing identical initial voltage conditions, regardless of signal value, to mitigate acquisition glitch may extend beyond the exemplary embodiments discussed above. In general, any switching devices or electron device structures that exhibit the properties of switch terminal capacitance and voltage threshold for their switching function are likely to benefit from identical terminal voltage initial conditions prior to track-to-hold switching for differential glitch suppression. This results because all switching devices have a finite turn-on time and the voltage excursion across the switching capacitance required to turn each device on depends on the voltage difference between the initial condition and the turn-on threshold voltage. The differential switching transient in a differential switching configuration in accordance with one embodiment of the method of mitigating acquisition glitch of this invention will be minimized when the transient voltage excursion on each half-circuit is made as identical as possible.

In one embodiment, the method may include the step of clamping the inputs of the switching circuit to the sensed differential voltage in the hold mode such that the initial conditions of switching transistors of the switching circuit are approximately identical prior to a hold-to-track transition to mitigate acquisition glitch. The method may include the step of providing a plurality of switched emitter followers. The method may further include the step of setting the base voltages, each emitter follower to a predetermined value to create identical initial conditions on each base emitter capacitance of each emitter follower prior to a hold-to-track transition.

In a dual rank T/H circuit, significant benefit may be obtained if a low glitch T/H can be used as the second rank because, although the second rank can block the glitch of the first rank device, the second rank glitch is fully presented at the output.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. A switched track-and-hold circuit with acquisition glitch suppression comprising:
    a track-and-hold circuit including:
        a switching circuit including:
            a plurality of switching transistors including a first transistor, and
            a first switch coupled to a current source and also directly coupled to an input terminal of the first transistor in a hold mode, and
        a plurality of storage devices, the switching circuit configured to apply a representation of an input signal to the input terminal of the first transistor and to the storage devices in a track mode and block a signal path between the input signal and the storage devices in the hold mode; and
    an acquisition glitch suppression circuit including:
        a replica amplifier configured to sense a differential voltage across the storage devices, and
        a switched clamping circuit configured to clamp, at an output of the switched clamping circuit, inputs of the switching circuit to thereby suppress an acquisition glitch.

2. The switched track-and-hold circuit of claim 1 further including an output buffer amplifier configured to buffer high impedance storage nodes coupled to the storage devices to provide low output impedance to drive at least one external device.

3. The switched track-and-hold circuit of claim 2 further including a buffer amplifier circuit coupled between the switching circuit and the output buffer amplifier configured to buffer high impedance storage nodes coupled to the storage devices to provide low output impedance to the output buffer amplifier.

4. The switched track-and-hold circuit of claim 1 in which the switched clamping circuit includes a plurality of clamping transistors configured to clamp voltages at output terminals of the clamping transistors.

5. The switched track-and-hold circuit of claim 1, wherein the switched clamping circuit is electrically connected to a base of the first transistor without intervening resistors that would interfere with clamping of the inputs of the switching circuit during the hold mode.

6. The switched track-and-hold circuit of claim 1, wherein the output of the switched clamping circuit is directly connected to the inputs of the switching circuit.

7. The switched track-and-hold circuit of claim 1, wherein:
    the switched clamping circuit is configured to clamp, at the output of the switched clamping circuit, the inputs of the switching circuit to the sensed differential voltage in the hold mode such that voltages applied to inputs of the switching circuit remain independent of changes in the input signal; and
    the acquisition glitch is a glitch associated with a hold to track transition due to different turn-on times for the switching transistors, the different turn-on times resulting from imbalanced initial conditions on the switching transistors.

8. A switched track-and-hold circuit with acquisition glitch suppression comprising:
    a track-and-hold circuit including:
        a switching circuit including a plurality of switching transistors, and
        a plurality of storage devices, wherein the switching circuit is configured to apply a representation of an input signal to the storage devices in a track mode and to block a signal path between an input connection receiving the input signal and the storage devices in a hold mode such that a transition from the track mode to the hold mode causes the storage devices to store a time sample of the input signal; and
    a circuit element coupled to one of the plurality of switching transistors and configured to emulate an off-state base-emitter capacitance of the one of the plurality of switching transistors to cancel off-state signal feed-through, and
    an acquisition glitch suppression circuit configured to suppress an acquisition glitch associated with different turn-on times for a hold to track transition resulting from imbalanced voltage initial conditions on the plurality of switching transistors, the acquisition glitch suppression circuit including:
        a replica amplifier electrically coupled to the switching circuit and configured to provide an output indicative of a differential voltage across the storage devices, and
        a switched clamping circuit configured to receive the output from the replica amplifier, the switched clamping circuit being configured to clamp, at an output of the switched clamping circuit, inputs of the switching circuit independently of changes in the input signal during the hold mode.

9. The switched track-and-hold circuit of claim 8 in which the track-and-hold circuit further includes an output buffer amplifier configured to buffer high impedance storage nodes coupled to the storage devices to provide low output impedance to drive at least one external device.

10. The switched track-and-hold circuit of claim 8 in which the switching circuit includes a plurality of switched emitter-followers.

11. The switched track-and-hold circuit of claim 8 which the switched clamping circuit is configured to clamp the inputs of the switching circuit such that the voltage initial condition on each of the switching transistors is approximately the same prior to a transition from the hold mode to the track mode.

12. The switched track-and-hold circuit of claim 8 in which the switched clamping circuit includes a plurality of clamping transistors.

13. The switched track-and-hold circuit of claim 8, further comprising:
    a first switch configured to couple a first current source to an emitter of the one of the plurality of switching transistors in a track mode and to directly couple the first current source to a base of the one of the plurality of switching transistors in a hold mode without any resistors between the first current source and the base of the one of the plurality of switching transistors.

14. The switched track-and-hold circuit of claim 8, wherein the output of the switched clamping circuit is directly connected to bases of the two switching transistors of the plurality of switching transistors.

15. A switched track-and-hold circuit with acquisition glitch suppression comprising:
   a track and hold circuit operable in a track mode and a hold mode, the track and hold circuit comprising:
      storage devices;
      a switching circuit including a first transistor configured to isolate, in the hold mode, one of the storage devices from an input of the track and hold circuit; and
   an acquisition glitch suppression circuit comprising:
      a replica amplifier configured to sense a differential voltage across the storage devices; and
      a switched clamping circuit including an output switch, the output switch being directly connected to an input terminal of the first transistor, the switched clamping circuit configured receive an output of the replica amplifier and to clamp, using the output switch, the input terminal of the first transistor to thereby suppress an acquisition glitch resulting from the track and hold circuit transitioning from the hold mode to the track mode.

16. The switched track-and-hold circuit of claim 15, further comprising:
   a second transistor included in the switching circuit; and
   a first circuit coupled to the first transistor and the second transistor and configured to emulate an off-state base-emitter capacitance of the first transistor and an off-state base-emitter capacitance of the second transistor to cancel off-state signal feed-through.

17. The switched track-and-hold circuit of claim 15 in which the switching circuit includes a plurality of switched emitter-followers, and the first transistor is configured as one of the switched emitter-followers.

18. The switched track-and-hold circuit of claim 17 which base voltages of each switched emitter follower are set to a predetermined value which creates a same base-emitter voltage and base-emitter capacitance on each emitter follower to balance initial conditions of the switched emitter-followers prior to a hold to track transition.

19. The switched track-and-hold circuit of claim 17 further including at least one differential current switch coupled to the first transistor.

20. The switched track-and-hold circuit of claim 17 further including a buffer amplifier coupled between the plurality of switched emitter followers and the replica amplifier.

21. The switched track-and-hold circuit of claim 20 which the replica amplifier includes a differential amplifier coupled to the buffer amplifier.

\* \* \* \* \*

UNITED STATES PATENT AND TRADEMARK OFFICE
CERTIFICATE OF CORRECTION

PATENT NO. : 10,192,630 B1
APPLICATION NO. : 13/506329
DATED : January 29, 2019
INVENTOR(S) : Michael J. Hoskins It is certified that error appears in the above-identified patent and that said Letters Patent is hereby corrected as shown below:

In the Specification

In Column 1, Line 14, change "constant-such" to --constant such--.

In Column 6, Line 18, change "half-circuit-(in" to --half-circuit (in--.

In Column 10, Line 50, change "CO" to --C0--.

In Column 11, Line 31, change "Vclp" to --Vcl_p--.

In the Claims

In Column 16, Line 50, Claim 11, after "claim 8" insert --in--.

In Column 17, Line 20 (Approx.), Claim 15, after "configured" insert --to--.

In Column 18, Line 11, Claim 18, after "claim 17" insert --in--.

In Column 18, Line 24, Claim 21, after "claim 20" insert --in--.

Signed and Sealed this
Seventh Day of May, 2019

Andrei Iancu
*Director of the United States Patent and Trademark Office*